United States Patent
Koshimizu

[19]
[11] Patent Number: 6,162,323
[45] Date of Patent: *Dec. 19, 2000

[54] PLASMA PROCESSING APPARATUS

[75] Inventor: Chishio Koshimizu, Yamanashi-ken, Japan

[73] Assignees: Tokyo Electron Yamanashi Limited, Nirasaki; Japan Science and Technology Corporation, Kawaguchi, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/093,090

[22] Filed: Jun. 8, 1998

[30] Foreign Application Priority Data

Aug. 12, 1997 [JP] Japan ..................... 9-231751

[51] Int. Cl.[7] ........................................ C23F 1/02
[52] U.S. Cl. ................. 156/345; 118/723 I; 118/723 IR; 118/723 R
[58] Field of Search .................. 118/723 E, 723 ER, 118/723 I, 723 IR, 723 R, 723 MW; 156/345 P

[56] References Cited

U.S. PATENT DOCUMENTS

| | | | |
|---|---|---|---|
| 4,615,298 | 10/1986 | Yamazaki | 118/723 I |
| 4,624,214 | 11/1986 | Suzuki et al. | 118/719 |
| 4,808,553 | 2/1989 | Yamazaki | 437/100 |
| 4,828,369 | 5/1989 | Hotomi | 350/357 |
| 4,960,071 | 10/1990 | Akahori et al. | 118/722 |
| 4,988,642 | 1/1991 | Yamazaki | 437/101 |
| 5,110,438 | 5/1992 | Ohmi et al. | 204/298.34 |
| 5,124,014 | 6/1992 | Foo et al. | 204/192.32 |
| 5,284,544 | 2/1994 | Mizutani et al. | 156/345 |
| 5,385,624 | 1/1995 | Amemiya et al. | 156/345 |
| 5,423,936 | 6/1995 | Tomita et al. | 156/345 |
| 5,472,508 | 12/1995 | Saxena | 118/723 E |
| 5,512,102 | 4/1996 | Yamazaki | 118/723 MW |
| 5,728,253 | 3/1998 | Saito et al. | 156/345 |
| 5,780,313 | 7/1998 | Yamazaki | 437/235 |

*Primary Examiner*—Jeffrie R Lund
*Attorney, Agent, or Firm*—Oblon, Spivak, McClelland, Maier & Neustadt, P.C.

[57] ABSTRACT

The processing chamber of an etching apparatus is divided into a plasma generating space and a processing space by a grid electrode. A first feed gas is supplied from a gas source unit to the plasma generating space through a first flow control valve mechanism and a first gas supply line. A second feed gas is supplied from the gas source unit to the processing space through a second flow control valve mechanism and a second gas supply line. The interior of the processing chamber is evacuated by an exhaust pump through an exhaust line connected to the processing space. Each of the first and second flow control valve mechanisms has a plurality of valves whose opening degrees are separately controlled by a CPU.

20 Claims, 10 Drawing Sheets

PLASMA PROCESSING APPARATUS

BACKGROUND OF THE INVENTION

1. Field of the Invention

The present invention relates to an apparatus for plasma-processing a target object in the semiconductor processing system by using a plasma and, more particularly, to an inductive coupling type dry etching apparatus whose processing chamber is divided into a plasma generating space and a processing space. Note that semiconductor processing means various types of processing operations performed to manufacture, on a target object, e.g., a semiconductor wafer or an LCD substrate, semiconductor devices and structures including wiring layers and electrodes to be connected to the semiconductor devices by forming semiconductor layers, insulating layers, conductive layers, and the like on the target object with predetermined patterns.

2. Discussion of the Background

As a plasma processing apparatus in the semiconductor processing system, one is known in which the interior of its airtight processing chamber is divided into a plasma generating space and a processing space by a grid electrode formed with a large number of through holes. An inductive coupling type dry etching apparatus is available as an example of such a plasma processing apparatus. This dry etching apparatus has an RF (radio-frequency) antenna opposing the plasma generating space through a dielectric wall. In the etching apparatus of this type, a process performed when etching an oxide film ($SiO_2$ film) formed on the surface of a target object, i.e., a semiconductor wafer, is as follows.

First, the target object is placed on a lower electrode arranged in the processing space. Subsequently, the interior of the processing chamber is evacuated by an exhaust system connected to the processing space, thereby setting the entire portion of the interior of the processing chamber to a predetermined pressure-reduced atmosphere. While the interior of the processing chamber is continuously evacuated, a gas mixture of a process gas such as an inert gas, e.g., Ar, He, or Kr, and a reactive gas, e.g., $CF_4$, $C_4F_8$, or $CHF_3$, is supplied from a process gas supply system to the plasma generating space.

In this state, a plasma generating RF power is applied to the RF antenna so that the process gas supplied to the plasma generating space is excited and dissociated, thereby generating a high-density plasma. Simultaneously, a bias RF power is applied to the lower electrode to guide, through the grid electrode, an etchant in the plasma, e.g., CFx radicals, onto the oxide film on the surface of the wafer arranged in the processing space. Only a desired etchant in the plasma is introduced into the processing space by the grid electrode arranged as described above between the plasma generating space and the processing space, thereby etching the wafer.

The etching apparatus described above can perform etching at a high etching rate because it can generate a high-density plasma. On the other hand, dissociation of the reactive gas, e.g., CF-based gas, progresses excessively to sometimes degrade the etching selectivity of the oxide film. This poses a problem particularly when forming a contact hole having a high aspect ratio in a thick oxide film.

BRIEF SUMMARY OF THE INVENTION

It is, therefore, an object of the present invention to plasma-process, in a plasma processing apparatus in which the interior of its processing chamber is divided into a plasma generating space and a processing space by a grid electrode, a target object under desired processing conditions by controlling the dissociation degree of the process gas or the plasma density accurately and reliably.

According to a first aspect of the present invention, there is provided an apparatus for subjecting a target object to a plasma processing by using a plasma, comprising:

an airtight processing chamber;

a grid electrode that divides the processing chamber into a plasma generating space and a processing space, the grid electrode having a plurality of through holes for allowing the plasma generating space and the processing space to communicate with each other;

potential applying means for applying a potential to the grid electrode;

exciting means for exciting a gas in the plasma generating space to convert the gas into a plasma;

supporting means for supporting the target object in the processing space;

a gas supply system having a plurality of gas sources of different material gases to be supplied to the processing chamber, the gas supply system comprising first and second gas supply lines connected to the plasma generating space and the processing space, respectively, and the first and second gas supply lines being connected to the gas sources through first and second flow control valve mechanisms, respectively;

a controller for controlling opening degrees of the first and second flow control valve mechanisms in order to flow first and second feed gases, each consisting of one or a plurality of gases selected from the material gases, to the first and second gas supply lines, the controller being capable of changing compositions and flow rates of the first and second feed gases separately; and an exhaust system for evacuating an interior of the processing chamber and setting the interior of the processing chamber at a vacuum.

According to a second aspect of the present invention, there is provided an apparatus for subjecting a target object to a plasma processing by using a plasma, comprising:

an airtight processing chamber;

a grid electrode that divides the processing chamber into a plasma generating space and a processing space, the grid electrode having a plurality of through holes for allowing the plasma generating space and the processing space to communicate with each other;

potential applying means for applying a potential to the grid electrode;

exciting means for exciting a gas in the plasma generating space to convert the gas into a plasma;

supporting means for supporting the target object in the processing space;

a gas supply system having a plurality of gas sources of different material gases to be supplied to the processing chamber, the gas supply system comprising first and second gas supply lines connected to the plasma generating space and the processing space, respectively, and the first and second gas supply lines being connected to the gas sources through first and second flow control valve mechanisms, respectively;

an exhaust system for evacuating an interior of the processing chamber and setting the interior of the processing chamber at a vacuum, the exhaust system comprising first and second exhaust lines connected to the processing space and the plasma generating space, respectively; and a controller for controlling the exhaust system so that exhaust amounts of the first and second exhaust lines can be changed separately.

According to a third aspect of the present invention, there is provided an apparatus for subjecting a target object to a plasma processing by using a plasma, comprising:

an airtight processing chamber;

a grid electrode that divides the processing chamber into a plasma generating space and a processing space, the grid electrode having a plurality of through holes for allowing the plasma generating space and the processing space to communicate with each other, and the grid electrode being disposed to allow a change in conductance with respect to a gas flow flowing between the plasma generating space and the processing space;

potential applying means for applying a potential to the grid electrode;

exciting means for exciting a gas in the plasma generating space to convert the gas into a plasma;

supporting means for supporting the target object in the processing space;

a gas supply system having a plurality of gas sources of different material gases to be supplied to the processing chamber, the gas supply system having first and second gas supply lines connected to the plasma generating space and the processing space, respectively, and the first and second gas supply lines being connected to the gas sources through first and second flow control valve mechanisms, respectively; and an exhaust system for evacuating an interior of the processing chamber and setting the interior of the processing chamber at a vacuum.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Prior to developing the present invention, the present inventors conducted various experiments in an etching apparatus in which its processing chamber was divided into a plasma generating space and a processing space by a grid electrode. The present inventors particularly noted a structure in which gas supply lines were connected to the plasma generating space and the processing space, respectively. With this structure, predetermined gases corresponding to the plasma generating space and the processing space can be supplied to them through the respective gas supply lines in accordance with the processing conditions, i.e., the required degree of dissociation and plasma density of the process gas. Through the experiments, the present inventors obtained the following findings.

When a relatively large amount of reactive gas, e.g., CF-based gas, is supplied to the plasma generating space, a large amount of reactive gas can be dissociated. In other words, in this case, a relatively large amount of radicals having a high dissociation degree, e.g., C radicals, $C_2$ radicals, or F radicals, can be generated. When a relatively large amount of reactive gas is supplied to the processing space, a small amount of reactive gas can be dissociated. In other words, in this case, a relatively large amount of radicals having a low dissociation degree, e.g., CF radicals or $CF_2$ radicals, can be generated.

For example, when forming a contact hole having a high aspect ratio in the oxide film of the wafer, dissociation of the reactive gas in the plasma generating space is decreased by supplying a relatively large amount of reactive gas to the processing space. As a result, radicals having a low dissociation degree are generated in the processing space, and an etching operation at a high etching selectivity can be performed.

The plasma generating space and the processing space are partitioned by the grid electrode formed with a large number of through holes. Even if the predetermined gases are respectively supplied to the plasma generating space and the processing space independently of each other, they may sometimes be mixed with each other through the grid electrode depending on the state in the processing chamber. In this case, the degree of dissociation of the process gas cannot be controlled to a desired state. When the process gas is dissociated excessively, an etching operation at a high etching selectivity as described above is difficult to perform.

When the gas supply lines are respectively connected to the plasma generating space and the processing space and the interior of the processing chamber is evacuated by an exhaust system connected to the processing space, control parameters become complicated. Sometimes this makes it difficult to control the process gas supply amount and the exhaust gas amount. Furthermore, the plasma can be easily influenced by a change in process condition, e.g., the composition or pressure of the process gas. If the predetermined condition is not satisfied, a uniform, high-density plasma cannot be generated, and the target object cannot be processed uniformly.

The embodiments of the present invention that are made on the basis of these findings will be described hereinafter with reference to the accompanying drawing. In the following description, the constituent elements having substantially the same function and arrangement are denoted by the same reference numerals, and a repetitive description will be made only when necessary.

Figure 1:
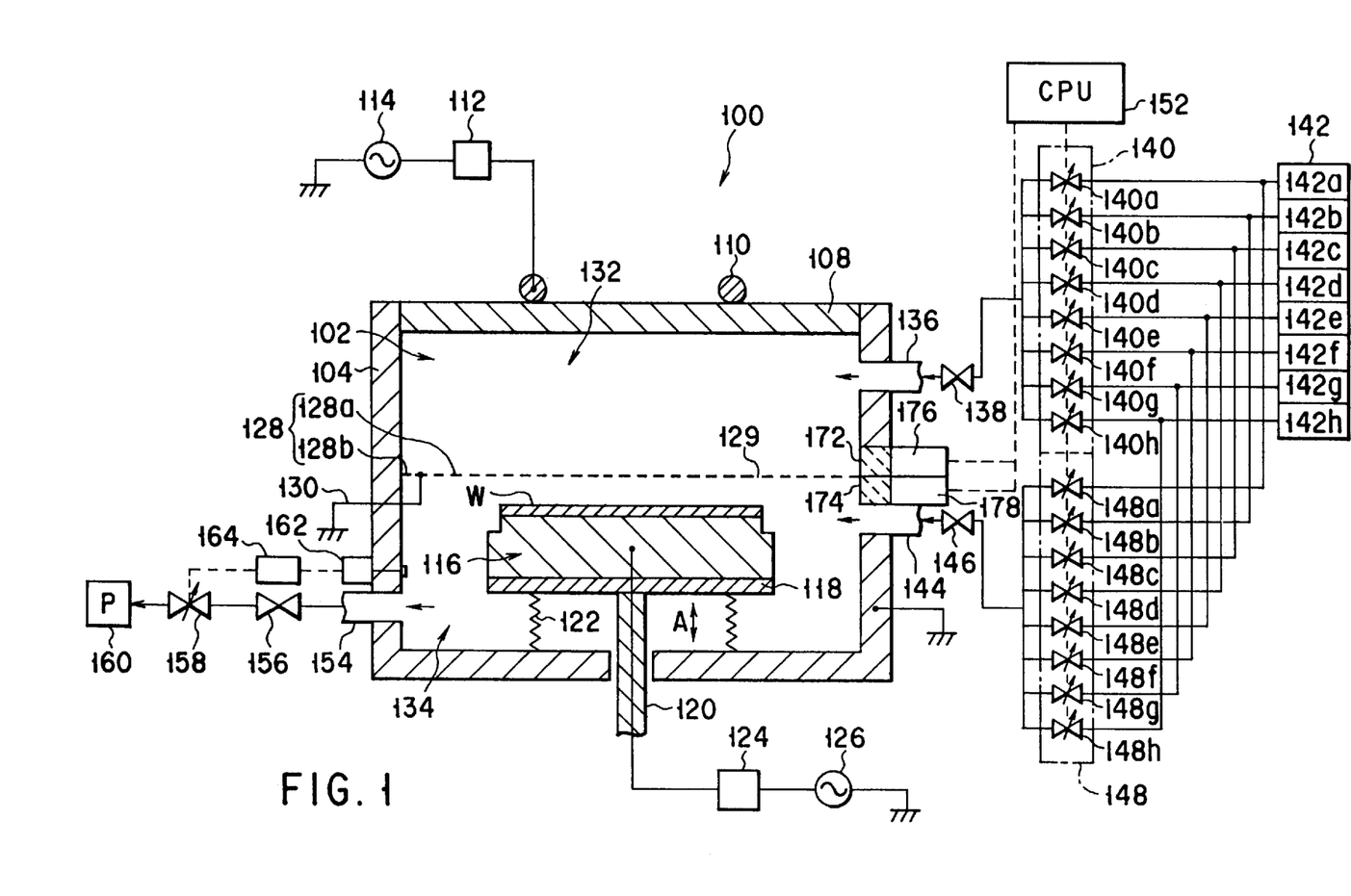
FIG. 1 is a schematic diagram showing an etching apparatus according to an embodiment of the present invention.

FIG. 1 is a schematic diagram showing an inductive coupling type dry etching apparatus 100 according to an embodiment of the present invention.

A processing chamber 102 of the etching apparatus 100 is formed in a substantially cylindrical airtight processing vessel 104 made of a conductive material. The processing vessel 104 itself is grounded through a ground line 106. The ceiling of the processing chamber 102 is formed of a dielectric wall 108 made of a dielectric material. A substantially annular RF (radio-frequency) antenna 110 is arranged on the dielectric wall 108. The RF antenna 110 is connected, through a matching unit 112, to a first RF power supply 114 which can output a plasma generating RF power.

A susceptor 116 made of a conductive material and forming a lower electrode is arranged in the lower portion of the processing chamber 102. A wafer W is placed on the work surface of the susceptor 116. An elevating shaft 120 is mounted on the susceptor 116 through an insulating member 118 arranged on the bottom surface portion of the susceptor 116. The elevating shaft 120 is connected to an elevating mechanism (not shown). Accordingly, upon operation of the elevating mechanism, the susceptor 116 can be vertically moved (in the direction of the double-headed arrow A in FIG. 1) through the elevating shaft 120. A bellows 122 made of an airtight member is mounted on the insulating member 118 around the elevating shaft 120 and the bottom surface of the processing chamber 102 to extend between them. Hence, even if the susceptor 116 is moved vertically, the airtightness in the processing chamber 102 is not impaired. The susceptor 116 is connected, through a matching unit 124, to a second RF power supply 126 that can output a bias RF power.

Figure 2:
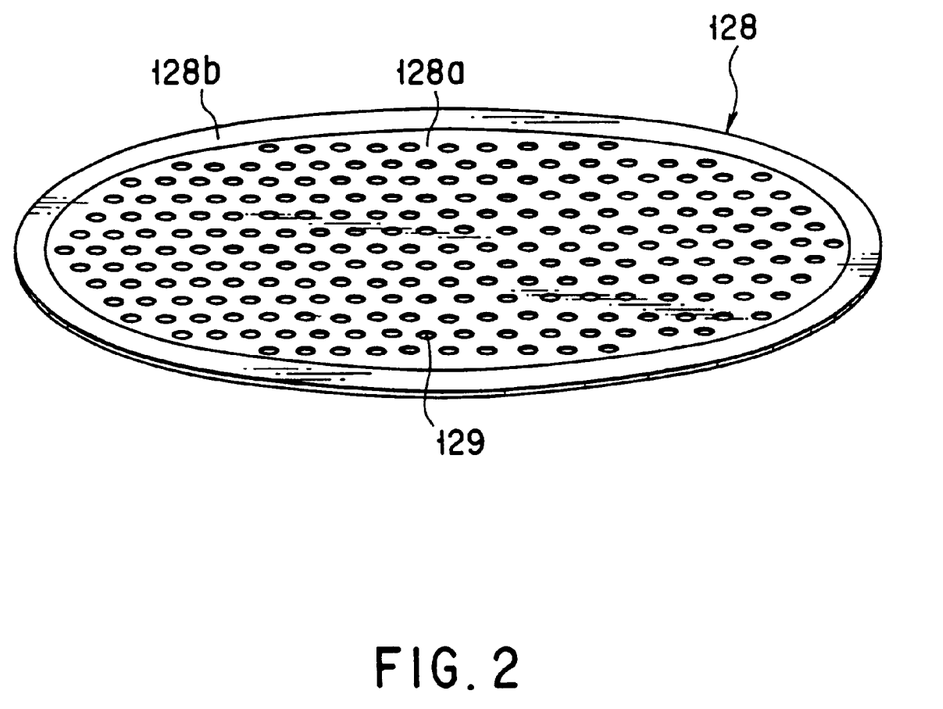
FIG. 2 is a perspective view showing the grid electrode of the apparatus shown in FIG. 1.

A substantially disk-like grid electrode 128 is arranged between the susceptor 116 and the dielectric wall 108 in the processing chamber 102. As shown in FIG. 2, the grid electrode 128 is constituted by a conductive portion 128a made of a conductive plate formed with a large number of substantially circular through holes 129, and an insulating portion 128b mounted to surround the conductive portion 128a. The conductive portion 128a is grounded through a ground line 130.

The grid electrode 128 is airtightly mounted, at its insulating portion 128b, on a predetermined position on the side wall of the processing chamber 102 with a mounting means (not shown). The mounting position of the grid electrode 128 is set in accordance with the state of the plasma to be generated in the processing chamber 102 and the processing conditions of the wafer W. The distance between the grid electrode 128 and the wafer W placed on the susceptor 116 can be adjusted as needed by vertically moving the susceptor 116.

With the grid electrode 128, a plasma generating space 132 is formed on the dielectric wall 108 side and a processing space 134 is formed on the susceptor 116 side in the processing chamber 102. The plasma generating space 132 and the processing space 134 communicate with each other through only the through holes 129 of the grid electrode 128.

The plasma generating space 132 and the processing space 134 are connected to first and second gas supply lines 136 and 144, respectively, of the process gas supply system. A gas source unit 142 of the process gas supply system has gas sources 142a to 142h of a plurality of different gases, e.g., eight different gases, to be supplied to the processing chamber 102. In this embodiment, the gases of the gas sources 142a to 142h are $CF_4$, $C_4F_8$, $CHF_3$, $C_2H_2F_4$, CO, $O_2$, Ar (or He or Ke), and $N_2$, respectively.

The first gas supply line 136 is connected to the gas source unit 142 through a first opening/closing valve 138 and a first flow control valve mechanism 140. The second gas supply line 144 is connected to the gas source unit 142 through a second opening/closing valve 146 and a second flow control valve mechanism 148. The first flow control valve mechanism 140 has eight flow control valves 140a to 140h corresponding to the respective gas sources 142a to 142h, and the second flow control valve mechanism 148 has eight flow control valves 148a to 148h corresponding to the respective gas sources 142a to 142h.

The operations of the first and second flow control valve mechanisms 140 and 148 are controlled by a controller (CPU) 152. More specifically, the CPU 152 separately controls the opening degrees of the respective valves of the first and second flow control valve mechanisms 140 and 148 so as to selectively supply the first and second feed gases, each consisting of one or a plurality of gases selected from the gases of the gas sources 142a to 142h, to the first and second gas supply lines 136 to 144, respectively. Therefore, the CPU 152 can separately change the composition and flow rate of the first and second feed gases flowing in the first and second gas supply lines 136 and 144.

The processing space 134 is connected to an exhaust line 154 of the exhaust system. The exhaust line 154 is connected to an exhaust pump 160 through an opening/closing valve 156 and a flow control valve 158. The exhaust pump 160 can evacuate the interior of the processing chamber 102 and set the interior of the processing chamber 102 at a vacuum. A pressure sensor 162 is connected to the interior of the processing space 134. A detection signal from the pressure sensor 162 is transmitted to a controller 164 and is utilized to control the opening degree of the flow control valve 158.

Optical transmission windows 172 and 174 are formed in the side wall of the plasma generating space 132 and processing space 134, respectively. Detectors 176 and 178 are disposed to optically detect the state of the plasma in the plasma generating space 132 and processing space 134 through the optical transmission windows 172 and 174. Each of the detectors 176 and 178 includes an optical lens, a spectroscope, a photoelectric transducer, an A/D (analog/digital) converter, and the like. Digital detection signals from the detectors 176 and 78 are sent to the CPU 152 and are utilized to control the operations of the first and second flow control valve mechanisms 140 and 148.

How to control the atmospheres in the plasma generating space 132 and processing space 134 will be described.

As described above, the plasma generating space 132 and processing space 134 are formed in the processing chamber 102 through the grid electrode 128. The plasma generating space 132 and processing space 134 communicate with each other through only the through holes 129 of the grid electrode 128. The interior of the processing chamber 102 is evacuated through only the exhaust line 154 connected to the processing space 134.

In this embodiment, the composition and flow rate of the first and second feed gases to be supplied to the plasma generating space 132 and processing space 134 can be changed separately. The atmospheres in the plasma generating space 132 and processing space 134 can therefore be adjusted substantially independently of each other.

More specifically, the first feed gas is supplied from the gas source unit 142 to the plasma generating space 132 through the first flow control valve mechanism 140, the first opening/closing valve 138, and the first gas supply line 136. When etching the oxide film formed on the surface of the wafer W, the first feed gas is used as a plasma generating gas, which is obtained, for example, by mixing an inert gas, e.g., Ar, He, or Kr, with a reactive gas, e.g., $CF_4$, $C_4F_8$, or $CHF_3$, in a smaller amount than that of the second feed gas.

The second feed gas is supplied from the gas source unit 142 to the processing space 134 through the second flow control valve mechanism 148, the second opening/closing valve 146, and the second gas supply line 144. When etching the oxide film formed on the D surface of the wafer W, the second feed gas is used as an etching gas, which is obtained, for example, by mixing an inert gas, e.g., Ar, He, or Kr, with a reactive gas, e.g., $CF_4$, $C_4F_8$, or $CHF_3$, in a larger amount than that of the first feed gas.

The composition and flow rate of the first and second feed gases are adjusted on the basis of the state of plasma generated in the plasma generating space 132, the amount of plasma entering the processing space 134 through the grid electrode 128, the etching conditions of the wafer W, and the like. This adjustment is performed by separately controlling the opening degrees of the respective valves of the first and second flow control valve mechanisms 140 and 148 with the CPU 152.

Even if the exhaust line 154 is connected to only the processing space 134, as in the etching apparatus 100, the atmospheres in the plasma generating space 132 and processing space 134 can be adjusted substantially independently of each other. Since the atmospheres in the plasma generating space 132 and processing space 134 can be controlled precisely, the second feed gas supplied to the processing space 134 can be prevented from entering the plasma generating space 132 through the grid electrode 128.

As a result, even in the etching apparatus 100 that can generate a high-density plasma, the plasma can be controlled, that is, the degree of dissociation of the reactive gas can be controlled arbitrarily and highly precisely. Even when forming a contact hole having a high aspect ratio in a thick oxide film, the etching selectivity can be improved largely.

The plasma generating space 132 is supplied with the plasma generating gas (first feed gas) obtained by mixing an inert gas with a reactive gas, e.g., CF-based gas, in a smaller amount than the reactive gas to be supplied to the processing space 134. Therefore, dissociation of the reactive gas in the plasma generating space 132 can be suppressed, and radicals, e.g., CF radicals or $CF_2$ radicals, having a low degree of dissociation can be generated in the plasma generating space 132.

The processing space 134 is supplied with an etching gas (second feed gas) obtained by mixing an inert gas with a reactive gas, e.g., CF-based gas, in a larger amount than the reactive gas to be supplied to the plasma generating space 132. Furthermore, the second feed gas in the processing space 134 is dissociated by only the plasma which is guided, with the bias RF power applied to the susceptor 116, from the plasma generating space 132 to the processing space 134 through the grid electrode 128. As a result, the wafer W can be etched with a predetermined amount of etchant species. Radicals, e.g., C radicals, $C_2$ radicals, or F radicals, having a high degree of dissociation can be generated in only the processing space 134. Accordingly, etching can be performed at a high etching selectivity and a high etching rate.

In this embodiment, the atmospheres in the plasma generating space 132 and processing space 134 can be adjusted accurately and reliably as needed by only controlling the opening degrees of the respective valves of the first and second flow control valve mechanisms 140 and 148 with the CPU 152. Even if the state of plasma in the processing chamber 102 changes during processing, dissociation of the reactive gas in the plasma generating space 132 and processing space 134 can always be maintained at a desired state as needed in accordance with this change.

How to etch the oxide film formed on the surface of the wafer W in the etching apparatus 100 will be described.

The wafer W is placed, with a convey mechanism (not shown), on the susceptor 116 arranged in the lower work position. The elevating mechanism (not shown) is actuated to move the susceptor 116 to an upper processing position through the elevating shaft 120. At this time, the position of the susceptor 116 is adjusted so that a predetermined gap is formed between the grid electrode 128 and the wafer W in accordance with the processing conditions with which the wafer W is processed.

The first opening/closing valve 138 and predetermined valves of the first flow control valve mechanism 140 are opened to supply the first feed gas from the gas source unit 142 to the plasma generating space 132. For example, the first feed gas contains a plasma generating gas which is a gas mixture of Ar and $C_4F_8$ in a smaller amount than that of $C_4F_8$ which is to be supplied to the processing space 134. Simultaneously, the second opening/closing valve 146 and predetermined valves of the second flow control valve mechanism 148 are opened to supply the second feed gas from the gas source unit 142 to the processing space 134. For example, the second feed gas contains an etching gas which is a gas mixture of Ar and $C_4F_8$ in a larger amount than that of $C_4F_8$ which is to be supplied to the plasma generating space 132. The composition and flow rate of the first and second feed gases are adjusted by separately controlling the opening degrees of the respective valves of the first and second flow control valve mechanisms 140 and 148 with the CPU 152.

Furthermore, the exhaust pump 160 is actuated, and the opening/closing valve 156 and the flow control valve 158 are opened, to evacuate the interior of the processing chamber 102 through the exhaust line 154. When the exhaust amount varies during the plasma processing, the opening degree of the flow control valve 158 is adjusted, to keep a constant pressure. This maintains the interiors of the plasma generating space 132 and processing space 134 respectively at desired atmospheres. Also, this prevents the process gas supplied to the processing space 134 from entering the plasma generating space 132 through the grid electrode 128.

Subsequently, a plasma generating RF power, e.g., a 13.56-MHz RF power, is applied from the first RF power supply 114 to the RF antenna 110 through the matching unit 112. Hence, an RF field is generated in the plasma generating space 132. This RF field excites the plasma generating gas to dissociate it, thereby generating a plasma. A bias RF power, e.g., 380-kHz RF power, is applied from the second RF power supply 126 to the susceptor 116 through the matching unit 124.

Desired radicals and ions in the plasma generated in the plasma generating space 132 enter the processing space 134 through the grid electrode 128. Because of the function of the ions and the like entering the processing space 134, the process gas supplied to the processing space 134 is dissociated in a desired state. The radicals and ions generated in this manner are supplied to the wafer W to etch the oxide film of the wafer W.

The etching apparatus 100 according to this embodiment can control the atmospheres in the plasma generating space 132 and processing space 134 independently of each other even if an exhaust line is connected to only the processing space 134. As a result, the degrees of dissociation of the process gases supplied to the plasma generating space 132 and processing space 134 independently of each other can be controlled arbitrarily.

Figure 3:
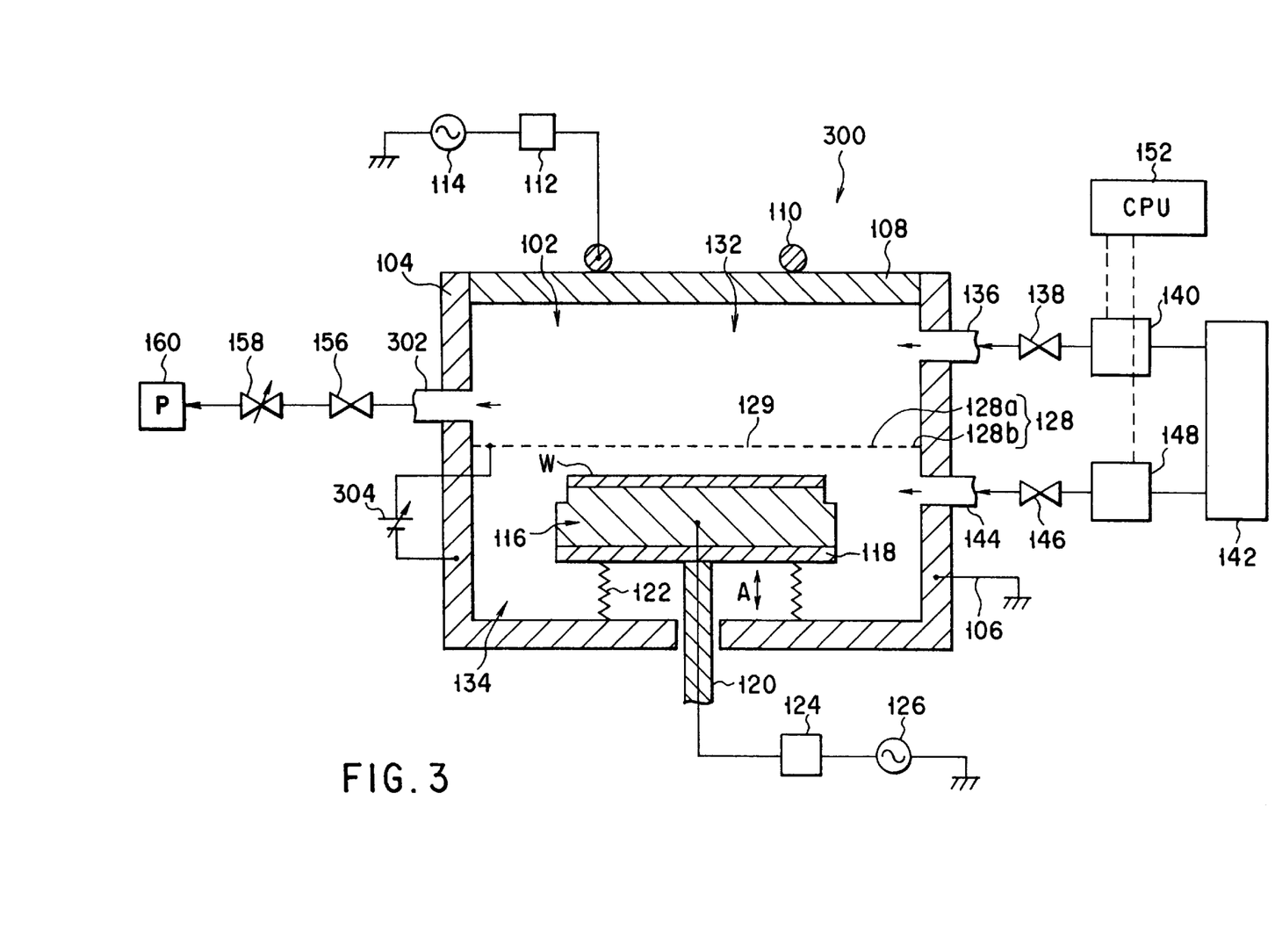
FIG. 3 is a schematic diagram showing an etching apparatus according to another embodiment of the present invention.

FIG. 3 is a schematic diagram showing an inductive coupling type dry etching apparatus 300 according to another embodiment of the present invention. In the embodiments shown in FIG. 3 and in the drawing following it, a detailed description and illustration of first and second flow control valve mechanisms 140 and 148, a gas source unit 142, a pressure sensor 162, plasma detectors 176 and 178, and the like will be omitted.

The basic arrangement of the etching apparatus 300 shown in FIG. 3 is identical to that of the etching apparatus 100 shown in FIG. 1, except for the following points. Specifically, in the dry etching apparatus 100 shown in FIG. 1, the exhaust line 154 is connected to the processing space 134, whereas in the dry etching apparatus 300 shown in FIG. 3, an exhaust line 302 is connected to a plasma generating space 132. The exhaust line 302 is connected to an exhaust pump 160 through an opening/closing valve 156 and a flow control valve 158. The exhaust pump 160 can evacuate the interior of a processing chamber 102 and set it at a vacuum.

The operation and effect of the etching apparatus 300 will be described.

In the same manner as in the etching apparatus 100 shown in FIG. 1, a first feed gas is supplied from the gas source unit 142 to the plasma generating space 132 through a first gas supply line 136, and a second feed gas is supplied from the gas source unit 142 to a processing space 134 through a second gas supply line 144. The interior of the processing chamber 102 is exhausted by an exhaust pump 160 through the exhaust line 302 connected to the plasma generating space 132.

A CPU 152 separately controls the opening degrees of the respective valves of the first and second flow control valve mechanisms 140 and 148 of the first and second gas supply lines 136 and 144. This can adjust and maintain the atmospheres in the plasma generating space 132 and processing space 134 at desired states. As a result, the respective process gases separately supplied to the plasma generating space 132 and processing space 134 can be dissociated at predetermined degrees of dissociation.

The potential applied to a grid electrode 128 of the etching apparatus 300 will be described.

The conductive portion 128a of the grid electrode 128 of the etching apparatus 100 shown in FIG. 1 is grounded through the ground line 130. In contrast to this, a conductive portion 128a of the grid electrode 128 of the etching apparatus 300 is connected to a variable DC power supply 304 that can variably output a DC power. The variable DC power supply 304 applies a predetermined DC power to the conductive portion 128a to generate a predetermined potential in the grid electrode 128. As a result, the condition with which radicals or ions in the plasma in the plasma generating space 132 are introduced to the processing space 134 can be changed.

Figure 4:
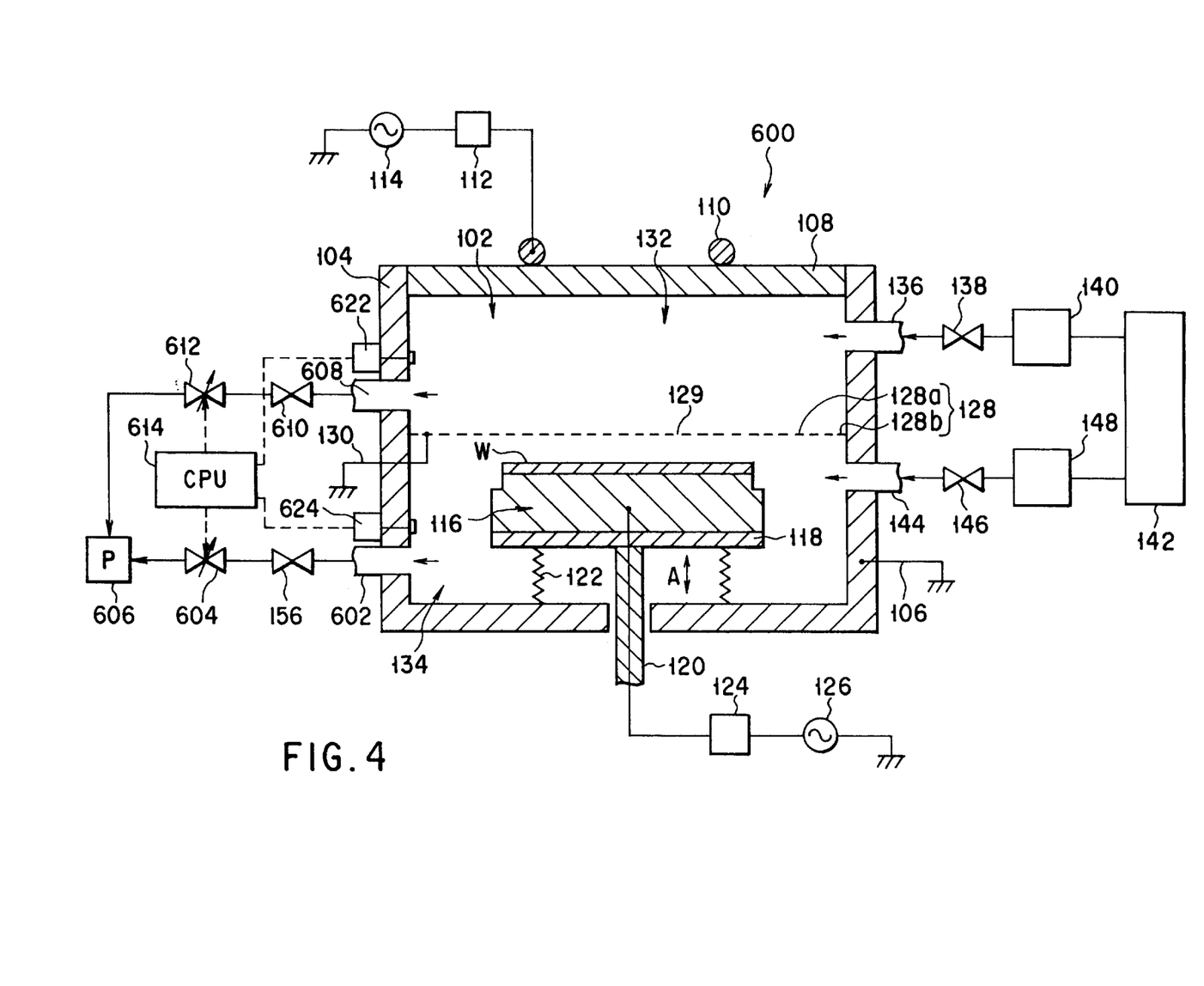
FIG. 4 is a schematic diagram showing an etching apparatus according to still another embodiment of the present invention.

FIG. 4 is a schematic diagram showing an inductive coupling type dry etching apparatus 600 according to still another embodiment of the present invention.

The basic arrangement of the etching apparatus 600 shown in FIG. 4 is identical to that of the etching apparatus 100 shown in FIG. 1, except for the following points. Specifically, in the etching apparatus 600 shown in FIG. 4, a processing space 134 and a plasma generating space 132 are connected to exhaust lines 602 and 608, respectively.

More specifically, the processing space 134 is connected to the first exhaust line 602. The first exhaust line 602 is connected to a common exhaust pump 606 through an opening/closing valve 156 and a flow control valve 604. Meanwhile, the plasma generating space 132 is connected to the second exhaust line 608. The second exhaust line 608 is connected to the common exhaust pump 606 through an opening/closing valve 610 and a flow control valve 612.

The opening degrees of the two flow control valves 604 and 612 are controlled by a controller (CPU) 614. The CPU 614 can separately change the exhaust amounts of the first and second exhaust lines 602 and 608 by controlling the opening degrees of the flow control valves 604 and 612. The processing space 134 and plasma generating space 132 are connected to pressure sensors 622 and 624, respectively. Detection signals from the pressure sensors 622 and 624 are transmitted to the CPU 614 and are utilized to control the opening degrees of the flow control valves 604 and 612.

The operation and effect of the etching apparatus 600 will be described.

A first feed gas is supplied from a gas source unit 142 to the plasma generating space 132 through a first gas supply line 136, and a second feed gas is supplied from the gas source unit 142 to the processing space 134 through a second gas supply line 144. The interior of a processing chamber 102 is evacuated by the exhaust pump 606 through the exhaust lines 602 and 608 connected to the processing space 134 and plasma generating space 132, respectively.

The opening degrees of the flow control valves 604 and 612 are separately controlled by the CPU 614 on the basis of the state of plasma to be generated in the plasma generating space 132, the amount of plasma entering into the processing space 134 through a grid electrode 128, and the conditions with which a wafer W is etched. Hence, the exhaust amounts of the first and second exhaust lines 602 and 608 can be changed separately, and the atmospheres in the plasma generating space 132 and processing space 134 can be adjusted further precisely and reliably. As a result, the wafer W can be etched with the desired-state plasma.

Not only the processing space 134 but also the plasma generating space 132 is connected to an exhaust line. Even if the process gas supplied to the processing space 134 flows into the plasma generating space 132 through the grid electrode 128, the gas in the plasma generating space 132 can be exhausted quickly through the exhaust line 608. The plasma generating space 132 can always be filled with the desired-state process gas and the degree of dissociation of the process as can always be maintained at a constant state. Furthermore, since the atmospheres in the plasma generating space 132 and processing space 134 are adjusted by the common exhaust pump 606, the cost of the apparatus can be decreased.

Figure 5:
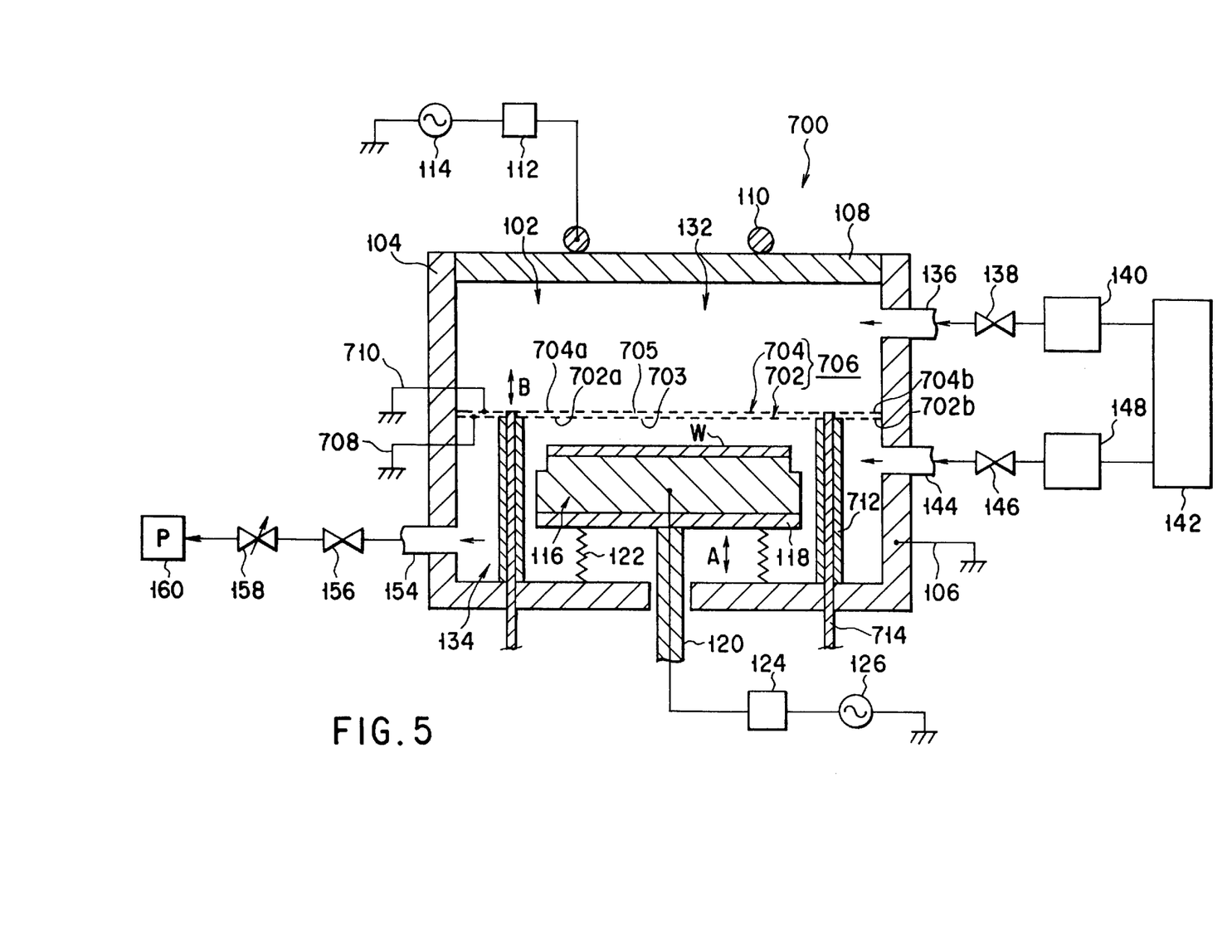
FIG. 5 is a schematic diagram showing an etching apparatus according to still another embodiment of the present invention.

FIG. 5 is a schematic diagram showing an inductive coupling type dry etching apparatus 700 according to still another embodiment of the present invention.

The basic arrangement of the etching apparatus 700 shown in FIG. 5 is identical to that of the etching apparatus 100 shown in FIG. 1, except for the following points. Specifically, in the etching apparatus 700 shown in FIG. 5, a grid electrode 706 is disposed to allow a change in conductance with respect to the gas flow flowing between a plasma generating space 132 and a processing space 134.

More specifically, the grid electrode 706 that divides the interior of a processing chamber 102 into the plasma generating space 132 and processing space 134 is constituted by first and second electrodes 702 and 704 that are stacked. The first electrode 702 is formed to be substantially identical to the grid electrode 128 shown in FIG. 2. More specifically, the first electrode 702 is constituted by a conductive portion 702a formed with a large number of through holes 703, and an insulating portion 702b. The conductive portion 702a is grounded through a ground line 708. The insulating portion 702b and the side wall of the processing chamber 102 are in airtight contact with each other.

Similarly, the second electrode 704 is constituted by a conductive portion 704a formed with a large number of through holes 705, and an insulating portion 704b. The conductive portion 704a is grounded through a ground line 710. A predetermined gap through which the second electrode 704 can move and with which airtightness can be maintained to some extent is formed between the insulating portion 704b and the side wall of the processing chamber 102. The through holes 703 and 705 of the first and second electrodes 702 and 704 are arranged to be offset from each other.

For example, the first electrode 702 is supported by a substantially tubular first support 712 fixed to the bottom surface portion of the processing chamber 102 and made of an insulating material. The second electrode 704 arranged on the first electrode 702 is supported by a second support 714 made of an insulating rod and inserted in the tube of the first support 712 to be movable in the vertical direction. Accordingly, upon operation of an elevating mechanism (not shown) connected to the second support 714, only the second electrode 704 can be moved in the vertical direction (in the direction of a double-headed arrow B in FIG. 5).

The operation and effect of the etching apparatus 700 will be described.

A first feed gas is supplied from a gas source unit 142 to the plasma generating space 132 through a first gas supply line 136, and a second feed gas is supplied from the gas source unit 142 to the processing space 134 through a second gas supply line 144. The interior of a processing chamber 102 is evacuated by an exhaust pump 160 through an exhaust line 154 connected to the processing space 134.

Upon operation of the elevating mechanism (not shown), the second electrode 704 is vertically moved as needed through the second support 714 to change the distance between the first and second electrodes 702 and 704. This changes the conductance with respect to the gas flow between the plasma generating space 132 and processing space 134. As a result, the atmospheres in the plasma generating space 132 and processing space 134 can be adjusted separately, and the respective process gases supplied to the plasma generating space 132 and processing space 134 can be dissociated at desired states.

Figure 6:
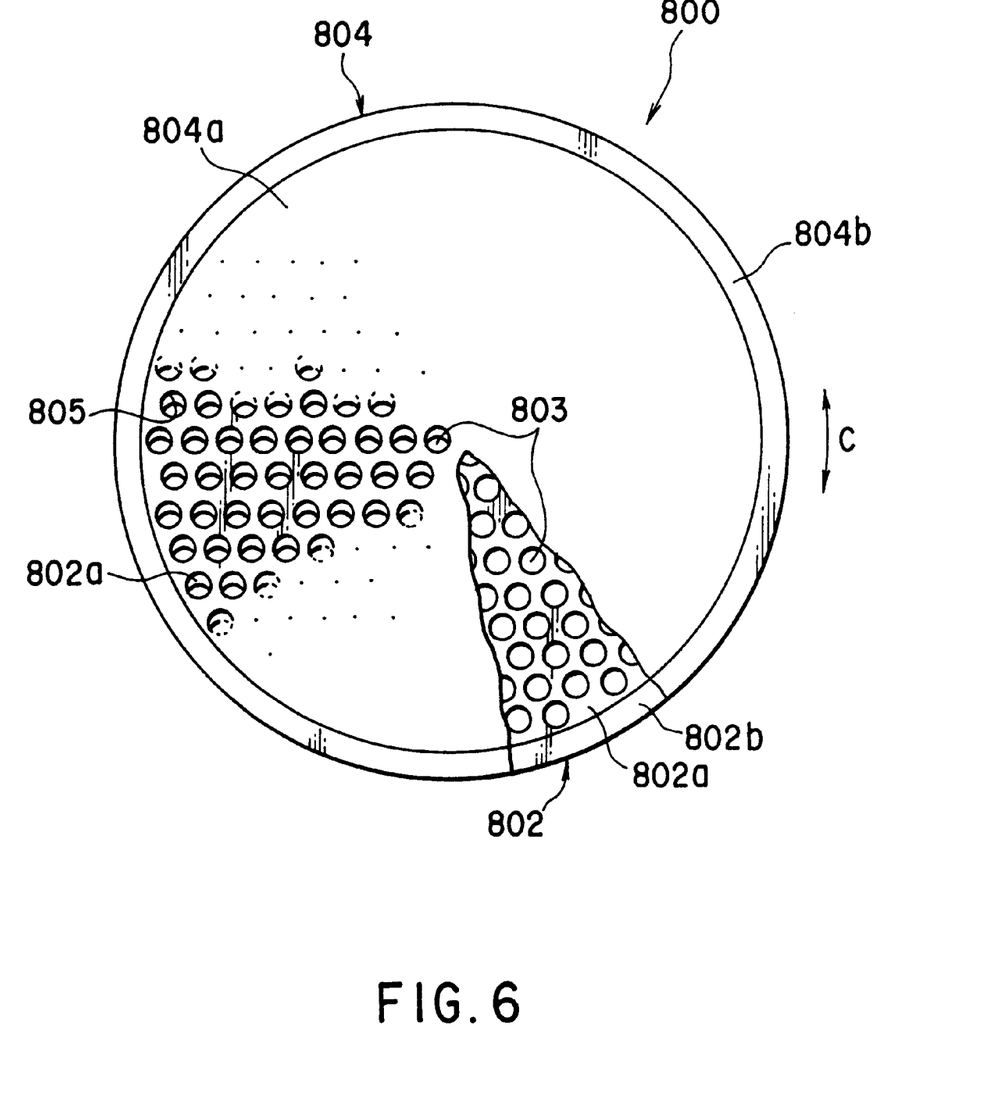
FIG. 6 is a perspective view showing a modification of the grid electrode of the apparatus shown in FIG. 5.

A grid electrode 800 shown in FIG. 6 can be used in place of the grid electrode 706 described above. The grid electrode 800 is constituted by first and second electrodes 802 and 804 that are airtightly stacked. The first electrode 802 is constituted by a conductive portion 802a formed with a large number of through holes 803, and an insulating portion 802b around it. Similarly, the second electrode 804 is constituted by a conductive portion 804a formed with a large number of through holes 805 having substantially the same shape as that of the through holes 803, and an insulating portion 804b around it. The through holes 803 of the first electrode 802 and the through holes 805 of the second electrode 804 communicate with each other. At least either one of the first and second electrodes 802 and 804 can rotate about the substantial center of the grid electrode 800 as the axis, i.e., in the direction of a double-headed arrow C in FIG. 6.

In the grid electrode 800 shown in FIG. 6, either one of the first and second electrodes 802 and 804 is rotated to change the positions of the through holes 803 and 805 relative to each other, so that the conductance with respect to the gas flow between the plasma generating space 132 and processing space 134 can be changed. More specifically, when the conductance is adjusted on the basis of the state of the plasma generated in the plasma generating space 132 and the like, the amount of gas flowing from the plasma generating space 132 into the processing space 134 through the grid electrode 800 can be adjusted. As a result, the respective feed gases supplied to the plasma generating space 132 and processing space 134 can be dissociated at predetermined degrees of dissociation.

Figure 7:
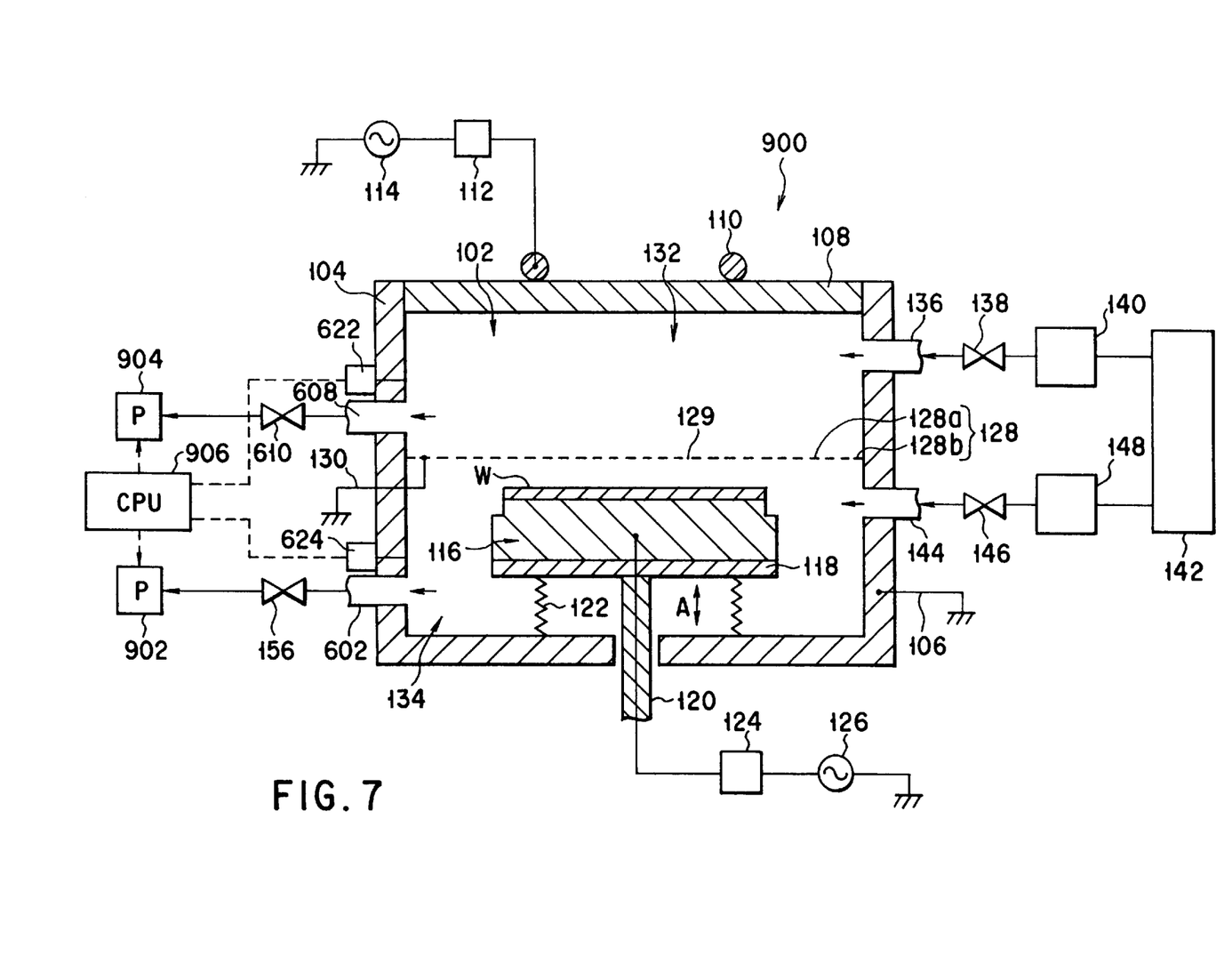
FIG. 7 is a schematic diagram showing an etching apparatus according to still another embodiment of the present invention.

FIG. 7 is a schematic diagram showing an inductive coupling type dry etching apparatus 900 according to still another embodiment of the present invention.

The basic arrangement of the etching apparatus 900 shown in FIG. 7 is identical to that of the etching apparatus 600 shown in FIG. 4, except for the following points. Specifically, in the etching apparatus 900 shown in FIG. 7, pumps 902 and 904 are separately provided to exhaust lines 602 and 608 respectively connected to a processing space 134 and a plasma generating space 132.

More specifically, the processing space 134 is connected to the first exhaust pump 902 through the first exhaust line 602 and an opening/closing valve 156. The plasma generating space 132 is connected to the second exhaust pump 904 through the second exhaust line 608 and an opening/closing valve 610.

The exhaust amounts of the first and second exhaust pumps 902 and 904 are controlled by a controller (CPU) 906. The CPU 906 can separately change the exhaust amounts of the first and second exhaust lines 602 and 608 by controlling the exhaust amounts of the first and second exhaust pumps 902 and 904. The processing space 134 and plasma generating space 132 are connected to pressure sensors 622 and 624, respectively. Detection signals from the pressure sensors 622 and 624 are transmitted to the CPU 906 and are utilized to control the exhaust amounts of the first and second exhaust pumps 902 and 904.

The operation and effect of the etching apparatus 900 will be described.

A first feed gas is supplied from a gas source unit 142 to the plasma generating space 132 through a first gas supply line 136, and a second feed gas is supplied from the gas source unit 142 to the processing space 134 through a second gas supply line 144. The interiors of the processing space 134 and plasma generating space 132 are respectively evacuated by the exhaust pumps 902 and 904 through the exhaust lines 602 and 608 connected to the processing space 134 and plasma generating space 132.

The exhaust amounts of the first and second exhaust pumps 902 and 904 are separately controlled by the CPU 906 on the basis of the state of the plasma generated in the plasma generating space 132, the amount of plasma entering the processing space 134 through a grid electrode 128, conditions with which a wafer W is etched, and the like. This adjusts the atmospheres in the plasma generating space 132 and processing space 134 further precisely and reliably. Accordingly, the wafer W can be etched with the plasma in the desired state. Since the two exhaust pumps 902 and 904 are provided, the interior of a processing chamber 102, i.e., the interiors of the plasma generating space 132 and processing space 134, can be evacuated quickly, thereby improving the throughput.

Figure 8:
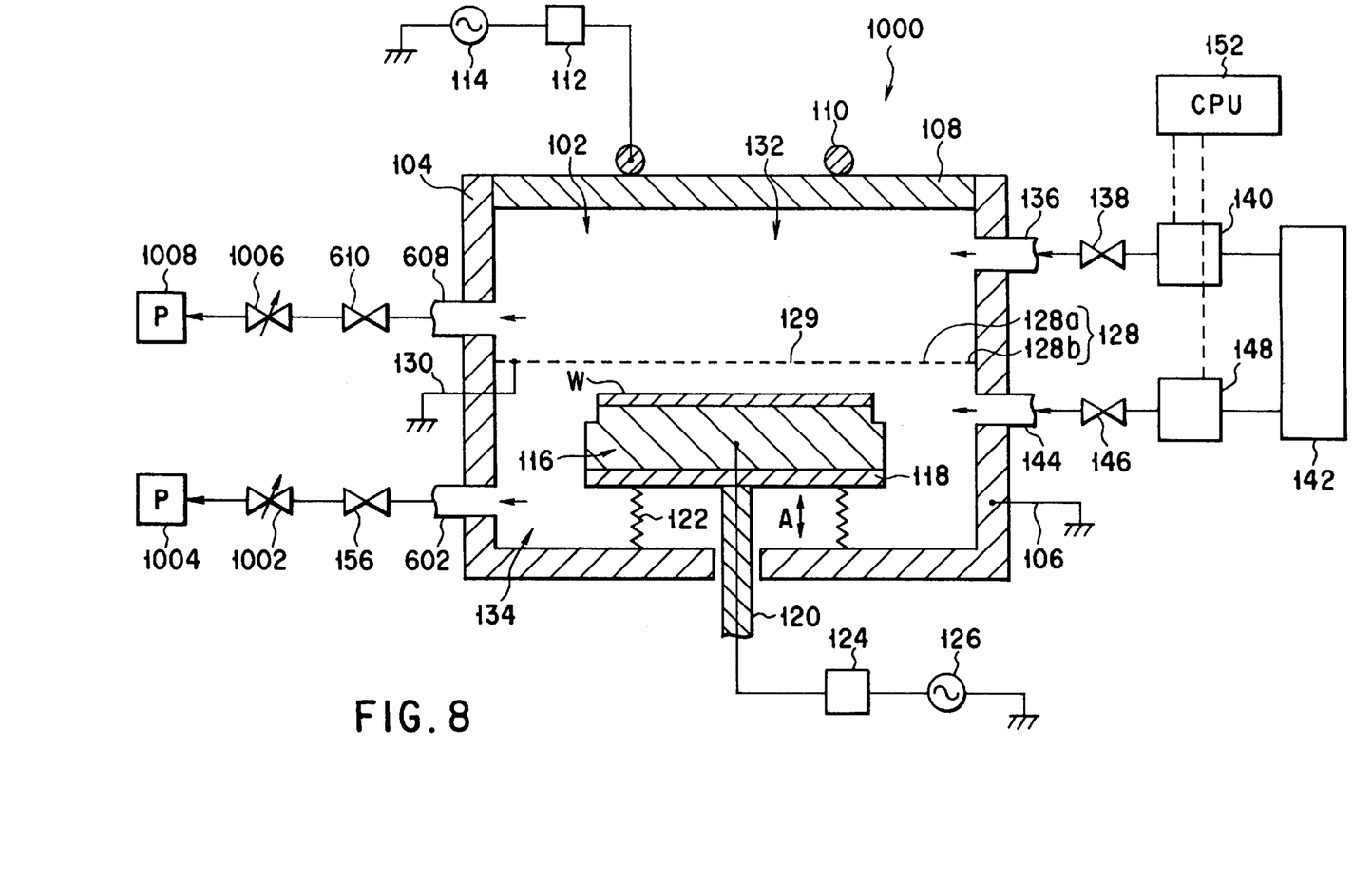
FIG. 8 is a schematic diagram showing an etching apparatus according to still another embodiment of the present invention.

FIG. 8 is a schematic diagram showing an inductive coupling type dry etching apparatus 1000 according to still another embodiment of the present invention.

The basic arrangement of the etching apparatus 1000 shown in FIG. 8 is identical to that of the etching apparatus 100 shown in FIG. 1, except for the following points. Specifically, in the etching apparatus 1000 shown in FIG. 8, a processing space 134 and a plasma generating space 132 are respectively connected to exhaust lines 602 and 604 individually provided with pumps 1004 and 1008.

More specifically, the processing space 134 is connected to the first exhaust pump 1004 through the first exhaust line 602, a third opening/closing valve 156, and a flow control valve 1002. The plasma generating space 132 is connected to the second exhaust pump 1008 through the second exhaust line 608, an opening/closing valve 610, and a flow control valve 1006.

The function and effect of the etching apparatus 1000 will be described.

A first feed gas is supplied from a gas source unit 142 to the plasma generating space 132 through a first gas supply line 136, and a second feed gas is supplied from the gas source unit 142 to the processing space 134 through a second gas supply line 144. The interiors of the processing space 134 and plasma generating space 132 are evacuated by the exhaust pumps 1004 and 1008 through the exhaust lines 602 and 608 connected to the processing space 134 and plasma generating space 132.

A CPU 152 separately controls the opening degrees of the respective valves of first and second flow control valve mechanisms 140 and 148 of the first and second gas supply lines 136 and 144. This adjusts and maintains the atmospheres in the plasma generating space 132 and processing space 134 in desired states. As a result, the respective process gases separately supplied to the plasma generating space 132 and processing space 134 can be dissociated at predetermined degrees of dissociation. Since the two exhaust pumps 1004 and 1008 are provided, the interior of a processing chamber 102, i.e., the interiors of the plasma generating space 132 and processing space 134, can be evacuated quickly, thereby improving the throughput.

Figure 9:
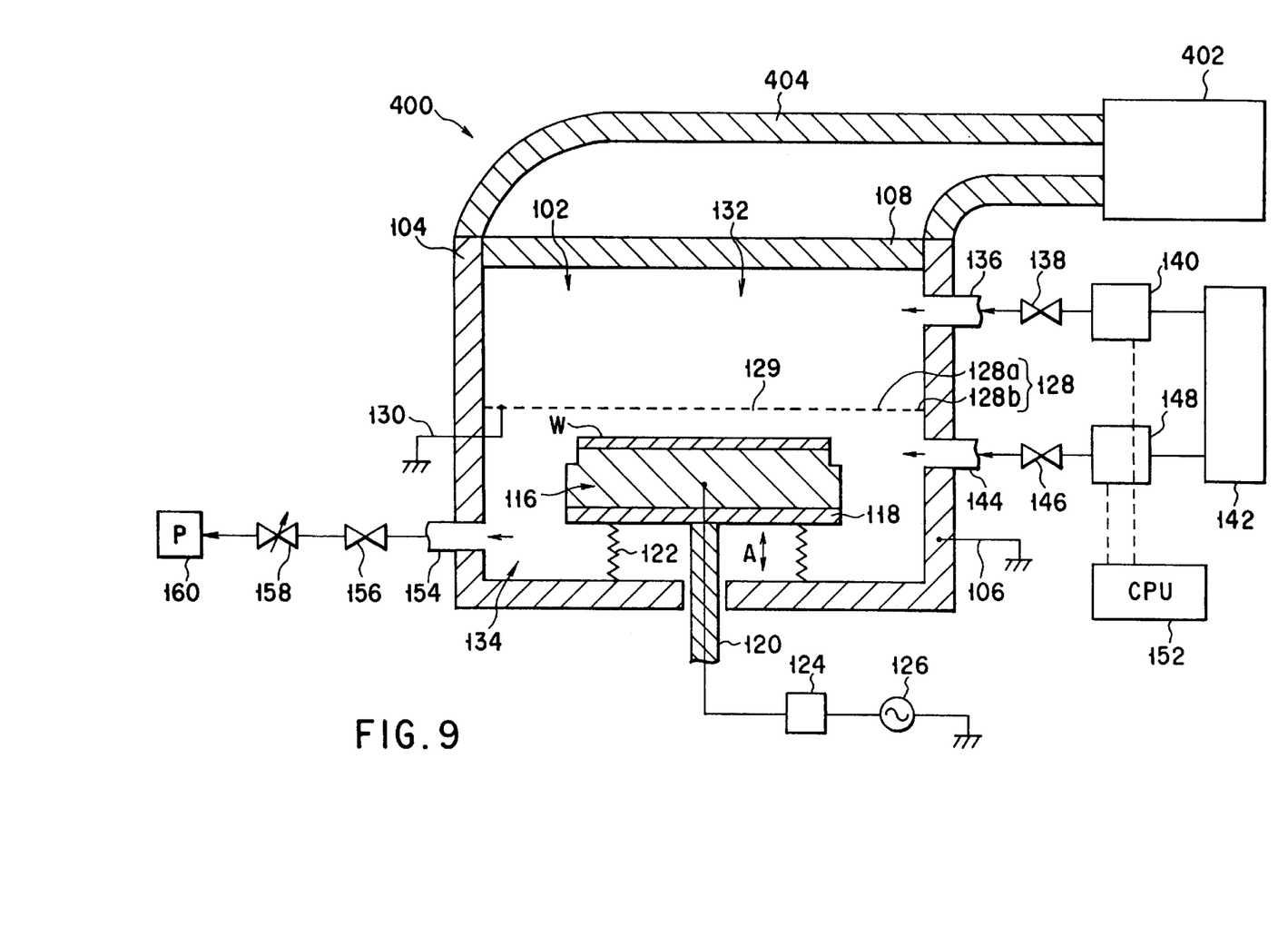
FIG. 9 is a schematic diagram showing an etching apparatus according to still another embodiment of the present invention.

FIG. 9 is a schematic diagram showing a microwave excitation type dry etching apparatus 400 according to still another embodiment of the present invention.

Each of the embodiments shown in FIGS. 1 to 8 is exemplified by an inductive coupling type etching apparatus having an RF antenna arranged on its dielectric wall. The present invention is not limited to this arrangement, but can similarly be applied to a plasma processing apparatus that generates a plasma with a microwave, as shown in FIG. 9.

The etching apparatus 400 has a microwave generating source 402 capable of oscillating, e.g., a 2.45-GHz microwave. A waveguide 404 is disposed above a dielectric wall 108 of a processing chamber 102. The waveguide 404 can diffuse the microwave transmitted from the microwave generating source 402 with its entire surface along the surface of the dielectric wall 108. Except for the microwave generating source 402 and the waveguide 404, the basic arrangement of the etching apparatus 400 is identical to that of the etching apparatus 100 shown in FIG. 1.

The operation and effect of the etching apparatus 400 will be described.

A first feed gas is supplied from a gas source unit 142 to a plasma generating space 132 through a first gas supply line 136, and a second feed gas is supplied from the gas source unit 142 to a processing space 134 through a second gas supply line 144. The interior of the processing chamber 102 is evacuated by an exhaust pump 160 through an exhaust line 154 connected to the processing space 134.

A microwave is oscillated by the microwave generating source 402 and transmitted into the plasma generating space 132 through the waveguide 404 and the dielectric wall 108. As a result, the first feed gas is excited and dissociated, so that it is converted into a plasma in the plasma generating space 132.

A CPU 152 separately controls the opening degrees of the respective valves of first and second flow control valve mechanisms 140 and 148 of the first and second gas supply lines 136 and 144. This adjusts and maintains the atmospheres in the plasma generating space 132 and second gas supply line 144 in desired states. As a result, the respective process gases separately supplied to the plasma generating space 132 and processing space 134 can be dissociated at predetermined degrees of dissociation.

Each of the etching apparatuses 300, 600, 700, 900, and 1000 according to the embodiments shown in FIGS. 1 to 8 can be modified to a microwave excitation type etching apparatus using a microwave generating source 402.

Figure 10:
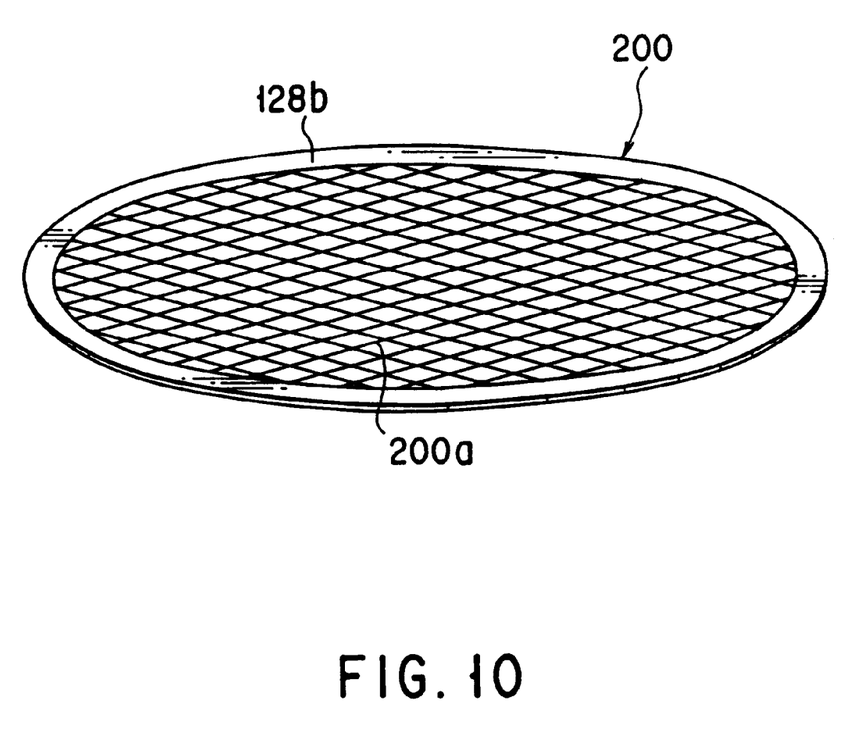
FIG. 10 is a perspective view showing another modification of the grid electrode.

FIG. 10 is a perspective view showing a modification of a grid electrode that can be used in any of the embodiments. A grid electrode 200 of this modification is constituted by a conductive mesh member 200*a* and an insulating portion 128*b* around it.

Although the grid electrode must be electrically insulated from the processing chamber 102, the insulating portion 128*b* of the grid electrode 128 or 200 is not indispensable. For example, in place of the insulating portion 128*b*, an insulating member can be mounted on the inner wall surface of the processing chamber 102 at a position where the grid electrode is arranged.

The present invention can be applied to a plasma processing apparatus that uses a shower head disposed in its processing chamber as a process gas supply system. The present invention can also be applied to a plasma processing apparatus other than an etching apparatus, e.g., an ashing apparatus or a CVD apparatus. The present invention can also be applied to a plasma processing apparatus for a target object other than a semiconductor wafer, e.g., an LCD glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for subjecting a target object to an etching process by using a plasma, comprising:

an airtight processing chamber;

a grid electrode that divides said processing chamber into a plasma generating space and a processing space, said grid electrode having a plurality of through holes for allowing said plasma generating space and said processing space to communicate with each other;

a potential applying mechanism configured to apply a potential to said grid electrode;

an exciting mechanism configured to excite a gas in said plasma generating space to convert the gas into a plasma;

a support member configured to support the target object in said processing space;

a gas supply system having a plurality of gas sources of a reactive gas and an inert gas for performing said etching process, said gas supply system comprising first and second gas supply lines connected to said plasma generating space and said processing space, respectively, and said first and second gas supply lines being connected to said gas sources through first and second flow control valve mechanisms, respectively, which provide a mixture of said reactive gas and said inert gas to each of said first and second gas supply lines;

a controller configured to control opening degrees of said first and second flow control valve mechanisms in order to flow first and second feed gases, each containing said reactive gas and said inert gas, to said first and second gas supply lines, said controller further configured to change compositions and flow rates of the first and second feed gases separately; and an exhaust system configured to evacuate an interior of said processing chamber and setting said interior of said processing chamber at a vacuum, wherein said controller sets compositions and flow rates of the first and second feed gases by controlling the opening degrees of said first and second flow control valve mechanisms, respectively, in accordance with an etching property for said etching process.

2. The apparatus according to claim 1, wherein said exhaust system comprises a first exhaust line connected to said processing space but does not comprise a second exhaust line connected to said plasma generating space.

3. The apparatus according to claim 1, wherein said exhaust system does not comprise a first exhaust line connected to said processing space but comprises a second exhaust line connected to said plasma generating space.

4. The apparatus according to claim 1, wherein said exhaust system comprises first and second exhaust lines connected to said processing space and said plasma generating space, respectively.

5. The apparatus according to claim 4, further comprising an exhaust controller configured to control said exhaust system so that exhaust amounts of said first and second exhaust lines are changed separately.

6. The apparatus according to claim 5, wherein said exhaust system comprises a shared exhaust pump, said first and second exhaust lines are connected to said shared exhaust pump through third and fourth flow control valve mechanisms, respectively, and said exhaust controller controls opening degrees of said third and fourth flow control valve mechanisms to change the exhaust amounts of said first and second exhaust lines.

7. The apparatus according to claim 5, wherein said exhaust system copies first end second exhaust pumps connected to said first and second exhaust lines, respectively, and said exhaust controller controls exhaust amounts of said first and second exhaust pumps to change the exhaust amounts of said first and second exhaust lines.

8. The apparatus according to claim 1, wherein said grid electrode is disposed to allow a change in conductance with respect to a gas flow flowing between said plasma generating space and said processing space.

9. The apparatus according to claim 8, wherein said grid electrode is formed by stacking first and second grid elements, and the conductance is changed by changing a distance between said first and second grid elements.

10. The apparatus according to claim 9, wherein said grid electrode is formed by stacking first and second grid elements, and the conductance is changed by changing positions in an angular direction of said first and second grid elements relative to each other, thereby changing a substantial opening area of said through holes.

11. The apparatus according to claim 1, wherein said potential applying mechanism comprises a variable DC power supply that applies a potential different from a ground potential to said grid electrode.

12. The apparatus according to claim 1, further comprising a detection mechanism connected to said controller to optically detect a state of the plasma in said processing chamber, thereby allowing said controller to control opening degrees of said first and second flow control valve mechanisms on the basis of a detection signal from said detection mechanism.

13. The apparatus according to claim 1, wherein said exciting mechanism comprises an RF antenna that opposes said plasma generating space through a dielectric wall, and a power supply configured to supply an RF power to said RF antenna.

14. The apparatus according to claim 1, wherein said exciting mechanism comprises a generator configured to generate a microwave and a member configured to supply the microwave to said plasma generating space through a dielectric wall.

15. The apparatus according to claim 1, wherein said reactive gas consists of a CF-based gas for selectively etching a semiconductor oxide film on said target object.

16. An apparatus for subjecting a target object to an etching process by using a plasma, comprising:

an airtight processing chamber;

a grid electrode that divides said processing chamber into a plasma generating space and a processing space, said grid electrode having a plurality of through holes for allowing said plasma generating space and said processing space to communicate with each other;

a potential applying mechanism configured to apply a potential to said grid electrode;

an exciting mechanism configured to excite a gas in said plasma generating space to convert the gas into a plasma;

a support member configured to support the target object in said processing space;

a gas supply system having a plurality of gas sources of a reactive gas and an inert gas for performing said etching process, said gas supply system comprising first and second gas supply lines connected to said plasma generating space and said processing space, respectively, said first gas supply line being connected to said gas sources through a first flow control valve mechanism, which includes a flow control valve connected to the gas source of the reactive gas and a flow control valve connected to the gas source of the inert gas, and said second gas supply line being connected to said gas sources through a second flow control valve mechanism, which includes a flow control valve connected to the gas source of the reactive gas and a flow control valve connected to the gas source of the inert gas, said first and second flow control mechanism thereby providing a mixture of said reactive gas and said inert gas to each of said first and second gas supply lines;

a controller configured to control said first and second flow control valve mechanisms by adjusting opening degrees of the flow control valves in order to flow first and second feed gases, each containing said reactive gas and said inert gas, to said first and second gas supply lines, said controller further configured to change compositions and flow rates of the first and second feed gases separately, wherein said controller sets compositions and flow rates of the first and second feed gases by controlling the opening degrees of said first and second flow control valve mechanisms, respectively, in accordance with an etching property for said etching process; and an exhaust system configured to evacuate an interior of said processing chamber and setting said interior of said processing chamber at a vacuum, wherein said exhaust system comprises an exhaust line connected to at least one of said processing space and said plasma generating space to exhaust said processing space and said plasma generating space.

17. The apparatus according to claim 16, further comprising a detection mechanism connected to said controller to optically detect a state of the plasma in said processing chamber, thereby allowing said controller to control said first and second flow control valve mechanisms on the basis of a detection signal from said detection mechanism.

18. The apparatus according to claim 17, wherein said grid electrode is disposed to allow a change in conductance with respect to a gas flow flowing between said plasma generating space and said processing space.

19. The apparatus according to claim 17, wherein said potential applying mechanism comprises a member that applies a ground potential to said grid electrode.

20. The apparatus according to claim 17, wherein said potential applying mechanism comprises a variable DC power supply that applies a potential different from a ground potential to said grid electrode.

* * * * *